(12) United States Patent
Tokuhiro

(10) Patent No.: US 6,275,073 B1
(45) Date of Patent: Aug. 14, 2001

(54) DIFFERENTIAL INPUT CIRCUIT

(75) Inventor: Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/401,304

(22) Filed: Sep. 23, 1999

(30) Foreign Application Priority Data

Oct. 30, 1998 (JP) .................................................. 10-311228

(51) Int. Cl.[7] .................................................. H03K 5/22
(52) U.S. Cl. .............................................. 327/66; 330/253
(58) Field of Search .................................. 327/52, 53, 65, 327/66, 70, 89, 427, 437, 490, 563; 323/315, 316; 330/288, 252, 253, 261, 257

(56) References Cited

U.S. PATENT DOCUMENTS

| | | | |
|---|---|---|---|
| 4,047,059 | * 9/1977 | Rosenthal | 327/66 |
| 5,036,219 | * 7/1991 | Dingwall et al. | 327/92 |
| 5,477,170 | * 12/1995 | Yotsuyanagi | 327/66 |
| 5,729,178 | * 3/1998 | Park et al. | 330/258 |
| 5,754,076 | * 5/1998 | Kimura | 327/563 |
| 5,844,433 | * 12/1998 | Nishimura | 327/94 |
| 5,990,741 | * 11/1999 | Yamamoto et al. | 330/253 |
| 5,994,962 | * 11/1999 | Watanabe et al. | 330/257 |

* cited by examiner

*Primary Examiner*—My-Trang Nu Ton
(74) *Attorney, Agent, or Firm*—Armstrong, Westerman, Hattori, McLeland & Naughton, LLP

(57) ABSTRACT

A differential input circuit which can positively operate over a wide input range is provided. The differential input circuit includes a first constant current source of a current mirror type which generates a positive current and a second constant current source of a current mirror type which generates a negative current. The first and second constant current sources constitute a differential amplifier circuit. A current switch which is connected to a positive input and a negative input is also connected to said first and second constant current sources so that an operating point of the differential amplifier circuit can be changed.

10 Claims, 3 Drawing Sheets

DIFFERENTIAL INPUT CIRCUIT

BACKGROUND OF THE INVENTION

1. Field of the Invention

The present invention relates to a differential input circuit, and particularly to a differential input circuit having CMOS circuits for high-speed signal transmission.

2. Description of the Related Art

Small-amplitude signal transmission has been widely used in CMOS circuits with an increase in a speed of signal transmission. The small-amplitude signal transmission is a technique which transmits signals so that the transmitted signals are not saturated, that is, switching transistors are not saturated. In the small-amplitude signal transmission, since transmitted signals are easily affected by a noise, differential signals are generally used.

In an interface system called LVDS (Low Voltage Differential Signals), small-amplitude signals having an amplitude of 100 mV at minimum are inputted and a logic level of the inputted signals must be determined. Additionally, the inputted signals have a wide voltage range ranging from 0 V to 2.4 V.

FIG.1 shows an example of a conventional differential input circuit. Transistors Tr11 and Tr12 constitute a current mirror circuit with their gates being connected to each other, and supply currents having the same amplitude to transistors Tr13 and Tr14. Precisely, the amplitudes of the currents supplied to the transistors Tr13 and Tr14 are proportional to widths of gates of the transistors Tr11 and Tr12, respectively. Thus, if the transistors Tr11 and Tr12 are designed to have the same physical dimension, currents having the same amplitude are supplied to the transistors Tr13 and Tr14.

An output voltage $V_{out}$ at an output terminal Out is changed when ON-state resistances between a drain and a source of the transistors Tr13 and Tr14 are changed in accordance with gate voltages of the transistors Tr13 and Tr14, which gate voltages correspond to input voltages of the circuit. When an input voltage $V_P$ at a $P_{-in}$ terminal connected to a gate of the transistor Tr13 is larger than an input voltage $V_N$ at an $N_{-in}$ terminal connected to a gate of the transistor Tr14, the output voltage $V_{out}$ is of a high level, and when $V_P$ is smaller than $V_N$, the output voltage $V_{out}$ is of a low level. A transistor 15 which is connected to sources of the transistors Tr13 and Tr14 functions to define a total current flowing through the circuit. That is, the transistor 15 functions as a constant current source.

However, the above-mentioned conventional circuit can operate only when a common voltage (a center value of differential input signals) is within a limited range. FIG. 2 is a diagram for illustrating the common voltage. The common voltage is defined as a center value $V_{ic}$ of the positive input voltage $V_P$ and the negative input voltage $V_N$ of a differential input circuit U.

For example, when both the input voltages $V_P$ and $V_N$ are so high that the transistor Tr15 is saturated, both the transistors Tr13, Tr14 are turned on. In this case, the output voltage $V_{out}$ is fixed to be of the low level. On the other hand, if both the input voltages $V_P$ and $V_N$ are lower than a threshold voltage of the transistors Tr13 and Tr14, both the transistors Tr13 and Tr14 are turned off. In this case, the output voltage $V_{out}$ is indefinite.

SUMMARY OF THE INVENTION

Accordingly, it is an object of the present invention to provide a differential input circuit which can positively operate over a wide range of the common voltage.

FIG. 3 is a diagram showing a principle of the present invention. As shown in FIG. 3, a current switch 20 is connected to a positive signal input $P_{-in}$ and a negative signal input $N_{-in}$. A first constant current source 21 of a current mirror type generating a positive current and a second constant current source 22 of a current mirror type generating a negative current are connected symmetrically to each other to constitute a differential amplifier circuit. The current switch 20 is connected to the first and second constant current sources so that an operating point of the differential amplifier circuit can be changed.

According to the invention, since the current switch 20 is provided so that the operating point of the differential amplifier circuit can be changed, as mentioned above, the differential input circuit can positively operate over a wide range of the common voltage.

The current switch may comprise a first switching part which controls a current derived from said first constant current source and a second switch part which controls a current derived from the second constant current source.

In this case, each of the first and second switch parts may comprise a first switch element connected to the positive input and a second switch element connected to the negative input. Further, the first and second switch parts may be constructed so that the first switch elements of said first and second switch parts are complementary to each other and the second switch elements of said first and second switch parts are complementary to each other.

In this invention, two complementary switch elements are connected to each of the positive input $P_{-in}$ and the negative input $N_{-in}$. Here, the term "complementary switch elements" means that whenever one of the switch elements is not operating, the other switch element is operating. Thus, according to the invention, when the common voltage is high, at least one of the complementary switch elements can operate, and when the common voltage is low, at least the other switch element can operate. Thus, the differential input circuit can operate over a wide range of the common voltage.

Other objects and further features of the present invention will be apparent from the following detailed description when read in conjunction with the accompanying drawings.

DESCRIPTION OF THE PREFERRED EMBODIMENTS

Figure 1:
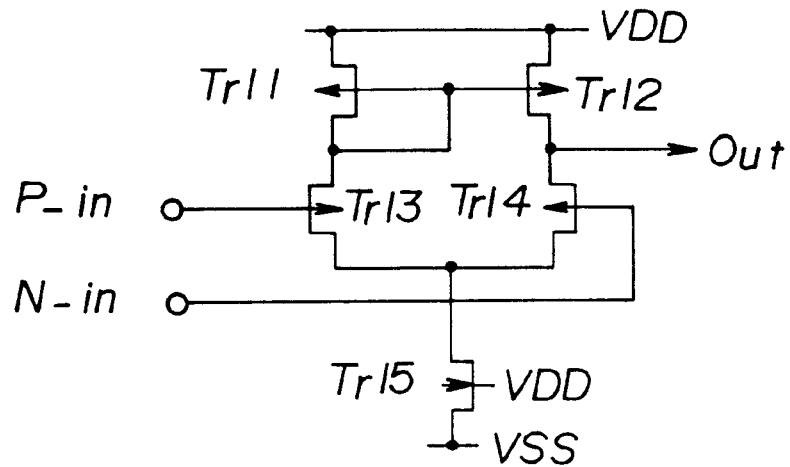
FIG.1 is a circuit diagram of an example of a conventional differential input circuit.
Figure 2:
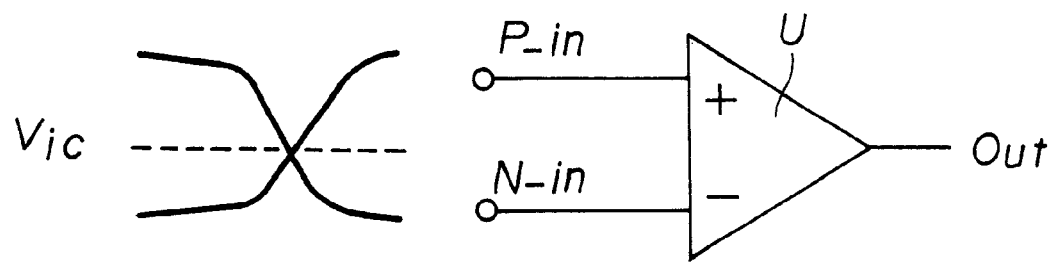
FIG. 2 is a diagram for illustrating a common voltage.
Figure 3:
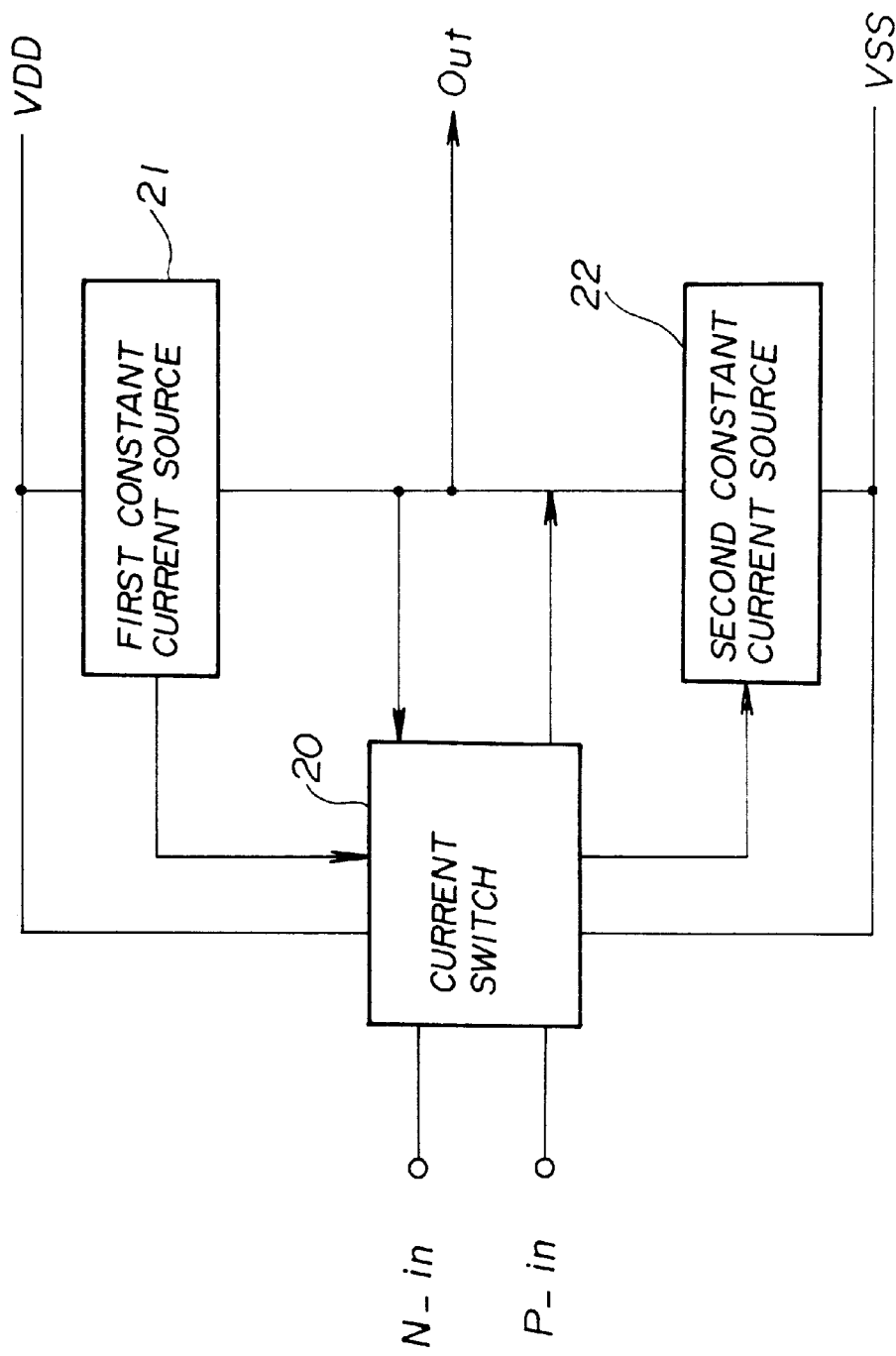
FIG. 3 is a block diagram showing a principle of the present invention.
Figure 4:
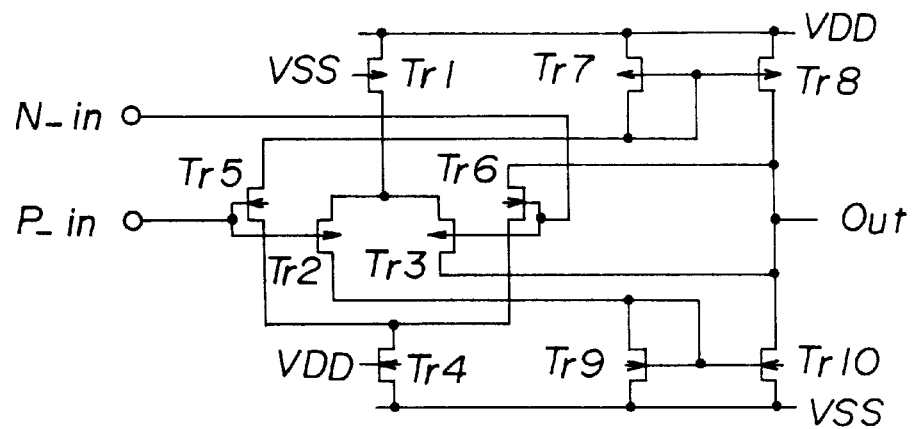
FIG. 4 is a circuit diagram showing a first embodiment of the present invention.

FIG. 4 is a circuit diagram showing a first embodiment of the present invention. In FIG. 4, P-channel transistors Tr7 and Tr8 constitute a P-channel constant current source, and N-channel transistors Tr9 and Tr10 constitute an N-channel constant current source. The circuit is designed so that currents flowing through the transistors Tr7 to Tr10 are the same when transistors Tr1 to Tr6 are not connected. In this case, a voltage (VDD−VSS)/2 (VDD is a higher power-supply voltage and VSS is a lower power-supply voltage) is outputted to an output terminal Out.

In the circuit shown in FIG. 4, since the P-channel constant current source is constituted by the P-channel transistors Tr7, Tr8 and the N-channel constant current source is constituted by the N-channel transistors Tr9, Tr10, the constant current sources can be complementarily used.

The transistors Tr1 to Tr6 which constitute a current switch are connected to the constant current sources. If the voltages $V_P$, $V_N$ at the inputs $P_{-in}$ and $N_{-in}$, respectively, are the same, amplitudes of currents which are derived from the transistors Tr7 and Tr8 via the transistors Tr5 and Tr6, respectively, are the same and amplitudes of currents which are supplied to the transistors Tr9 and Tr10 via the transistors Tr2 and Tr3, respectively, are the same. In this case, the differential input circuit is balanced.

Now, a description will be given of operations of the circuit when the input voltage $V_P$ and the input voltage $V_N$ are changed.

(A) When $V_P > V_N$ is established:

In this case, an ON-state resistance of the transistor Tr5 becomes smaller than that of the transistor Tr6 since a larger bias voltage is supplied to a gate of the transistor Tr5 than to a gate of the transistor Tr6. Thus, a current supplied to the transistor Tr5 from the transistor Tr7 becomes larger than a current supplied to the transistor Tr6 from the transistor Tr8. As a result, gate voltages of the transistors Tr7, Tr8 become lower and thus the output voltage $V_{out}$ becomes higher.

Additionally, an ON-state resistance of the transistor Tr2 becomes larger than that of the transistor Tr3. Thus, a current supplied to the transistor Tr9 from the transistor Tr2 becomes smaller than a current supplied to the transistor Tr10 from the transistor Tr3. As a result, gate voltages of the transistors Tr9, Tr10 becomes lower and thus the output voltage $V_{out}$ becomes higher.

(B) When $V_P < V_N$ is established:

In this case, the circuit operates in an opposite way as compared to the case where $V_P > V_N$ is established, and the output voltage $V_{out}$ becomes lower. That is, when $V_P < V_N$ is established, an ON-state resistance of the transistor Tr5 becomes larger than that of the transistor Tr6. Thus, a current supplied to the transistor Tr5 from the transistor Tr7 becomes smaller than a current supplied to the transistor Tr6 from the transistor Tr8. As a result, gate voltages of the transistors Tr7, Tr8 become higher and thus the output voltage $V_{out}$ becomes lower.

Additionally, an ON-state resistance of the transistor Tr2 becomes smaller than that of the transistor Tr3. Thus, a current supplied to the transistor Tr9 from the transistor Tr2 becomes larger than a current supplied to the transistor Tr10 from the transistor Tr3. As a result, the gate voltages of the transistors Tr9, Tr10 become higher and thus the output voltage $V_{out}$ becomes lower.

(C) When both the input voltages $V_P$ and $V_N$ are low:

If the voltages $V_P$ and $V_N$ become lower than a threshold voltage $V_{th}$ of the transistors Tr5, Tr6, currents are no longer derived from the transistors Tr7, Tr8 since the transistors Tr5, Tr6 are turned off. In this case, however, the transistors Tr2, Tr3 are operating. Therefore, the output voltage $V_{out}$ is determined by operating states of the transistors Tr9, Tr10 in accordance with a relationship between the voltages $V_P$ and $V_N$.

(D) When both the input voltages $V_P$ and $V_N$ are high:

If the voltage $V_P$ and $V_N$ are so high that the transistors Tr2, Tr3 are reversely biased, the transistors Tr2, Tr3 are turned off. In this case, however, the transistors Tr5, Tr6 are operating. Thus, the output voltage $V_{out}$ is determined by operating states of the transistors Tr7, Tr8 in accordance with a relationship between the input voltages $V_P$ and $V_N$.

As mentioned above, since currents derived from each of the constant current sources are controlled by the current switch constituted by the transistors Tr2, Tr3, T5, Tr6, an operating point of the differential amplifier circuit constituted by constant current sources is changed in accordance with the operating states of the current switch. Thus, according to the present embodiment, it is possible to positively operate the differential input circuit in accordance with the input voltages $V_P$ and $V_N$.

Additionally, since two complementary transistors (namely, the N-channel transistor Tr5 or Tr6 and the P-channel transistor Tr2 or Tr3) are connected to each of the input terminals $P_{-in}$ and $N_{-in}$, at least one of the complementary transistors can always operate regardless of the input voltage level. Thus, according to the present embodiment, it is possible to positively operate the differential amplifier circuit in accordance with the operating states of the current switch.

Further, since CMOS FETs are used as the transistors Tr2, Tr3, Tr5, Tr6 constituting the current switch and these CMOS FETs are operated in a linear operating region, it is possible to achieve a high-speed operation of the current switch.

Figure 5:
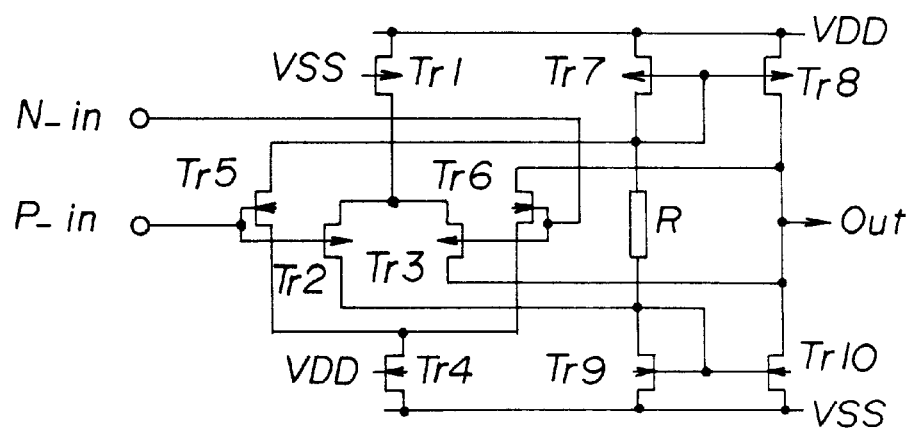
FIG. 5 is a circuit diagram showing a second embodiment of the present invention.

FIG. 5 is a circuit diagram showing a second embodiment of the present invention. In FIG. 5, those parts which are the same as the parts shown in FIG. 4 are given the same reference numerals, and descriptions thereof will be omitted. In the present embodiment, a bypass resistor R is connected between the P-channel constant current source and the N-channel constant current source as shown in FIG. 5.

In the above-mentioned first embodiment, when the transistor Tr2 or Tr5 is turned off, the transistor Tr9 or Tr7 is turned off accordingly, since no current is supplied to the transistor Tr9 when the transistor Tr2 is turned off and no current is derived from the transistor Tr7 when the transistor Tr5 is turned off. Thus, if the input voltages $V_P$ and $V_N$ are so high (or low) that the transistor Tr2 (or Tr5) is turned off, the output voltage $V_{out}$ does not exhibit a change as expected when both the transistors Tr2 and Tr5 are operating.

In the present embodiment, the resistor R functions to prevent the transistors Tr9, Tr7 from being turned off when the transistors Tr2, Tr5 are turned off, respectively. This function is achieved by supplying a small current from the transistor Tr7 to the transistor Tr9. Thus, the resistor R can be replaced by a transistor.

According to the present embodiment, a bias current, which is smaller than a current flowing through the current switch, flows through the resistor R between the P-channel constant current source and the N-channel constant current source. Thus, if one of the transistors Tr2 and Tr5 is turned off, the corresponding transistor Tr6 or Tr3 can control the output voltage $V_{out}$ by changing a current derived from the transistor Tr7 or a current supplied to the transistor Tr9 in accordance with the negative input voltage $V_N$.

As mentioned above, the differential input circuit of the present embodiment is achieved by simply providing the resistor R (or a transistor) in the differential input circuit of the above-mentioned first embodiment. Thus, according to the present embodiment, the above-mentioned function can be achieved by a simple structure.

The present invention is not limited to these embodiments, but variations and modifications may be made without departing from the scope of the present invention.

The present application is based on Japanese priority application No. 10-311228 filed on Oct. 30, 1998, the entire contents of which are hereby incorporated by reference.

What is claimed is:

1. A differential input circuit, comprising:
   a first constant current source of a current mirror type which generates a positive current;
   a second constant current source of a current mirror type which generates a negative current; and
   a current switch which includes a differential amplifier circuit and is connected to a positive input, a negative input, and said first and second constant current sources so that an operating point of said differential amplifier circuit can be changed.

2. The differential input circuit as claimed in claim 1, wherein said first constant current source comprises P-channel transistors and said second constant current source comprises N-channel transistors.

3. The differential input circuit as claimed in claim 1, wherein said current switch comprises a first switch part which controls a current derived from said first constant current source and a second switch part which controls a current derived from said second constant current source.

4. The differential input circuit as claimed in claim 3, wherein each of said first and second switch parts comprises a first switch element connected to said positive input and a second switch element connected to said negative input.

5. The differential input circuit as claimed in claim 4, wherein said first switch elements of said first and second switch parts are complementary to each other, and said second switch elements of said first and second switch parts are complementary to each other.

6. The differential input circuit as claimed in claim 5, wherein said complementary switch elements comprise an N-channel transistor and a P-channel transistor.

7. The differential input circuit as claimed in claim 3, wherein each of said first and second switch parts comprises a CMOS FET.

8. The differential input circuit as claimed in claim 1, further comprising:
   a bypass circuit which allows a flow of a small current between said first and second constant current sources.

9. The differential input circuit as claimed in claim 8, wherein said bypass circuit comprises a resistor.

10. The differential input circuit as claimed in claim 8, wherein said bypass circuit comprises a transistor.

* * * * *